United States Patent
Jeong et al.

(10) Patent No.: US 12,272,425 B2
(45) Date of Patent: Apr. 8, 2025

(54) MEMORY CONTROLLER PERFORMING TRAINING TO IMPROVE COMMUNICATION AND METHOD OF OPERATING THE SAME

(71) Applicant: SK hynix Inc., Gyeonggi-do (KR)

(72) Inventors: Nam Hyeok Jeong, Gyeonggi-do (KR); Kwang Ho Choi, Gyeonggi-do (KR); Moon Hyeok Choi, Gyeonggi-do (KR); Tae Woong Ha, Gyeonggi-do (KR); Yong Wan Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 119 days.

(21) Appl. No.: 17/845,259

(22) Filed: Jun. 21, 2022

(65) Prior Publication Data
US 2023/0215477 A1 Jul. 6, 2023

(30) Foreign Application Priority Data
Dec. 31, 2021 (KR) ........................ 10-2021-0193757

(51) Int. Cl.
*G11C 29/00* (2006.01)
*G06F 18/214* (2023.01)
(Continued)

(52) U.S. Cl.
CPC .............. *G11C 7/20* (2013.01); *G06F 18/214* (2023.01); *G06N 20/00* (2019.01); *G11C 7/1066* (2013.01); *G11C 7/1069* (2013.01); *G11C 7/1093* (2013.01); *G11C 7/1096* (2013.01); *G11C 11/4074* (2013.01); *G11C 29/00* (2013.01); *G11C 29/023* (2013.01); *G11C 29/10* (2013.01);
(Continued)

(58) Field of Classification Search
CPC ....... G11C 7/20; G11C 7/1066; G11C 7/1069; G11C 7/1093; G11C 7/1096; G11C 11/4074; G11C 29/00; G11C 29/023; G11C 29/10; G11C 29/56012; G11C 2029/0407; G06F 18/214; G06F 13/1668; G06F 13/4234; G06N 20/00
See application file for complete search history.

(56) References Cited

U.S. PATENT DOCUMENTS 9,990,973 B1 * 6/2018 Jeter ................... G06F 13/1689
10,416,912 B2 9/2019 Morris et al.
(Continued)

OTHER PUBLICATIONS

Yong-Cheul Jun, Study on how to protect deep-learning-related inventions under the Korean Patent Act, 2020, p. 348-378.

*Primary Examiner* — Mushfique Siddique
(74) *Attorney, Agent, or Firm* — IP & T GROUP LLP

(57) ABSTRACT

The present technology relates to an electronic device. According to the present technology, a memory controller may include a training controller, a training data storage, and a machine learning processor. The training controller may perform training of correcting interface signals exchanged with a memory device, generate training data that is a result of the training, and output the training data as sample training data based on a comparison result of a training reference and the training data. The training data storage may store training history information including plural pieces of sample training data. The machine learning processor may update the training reference through machine learning based on the training history information.

20 Claims, 14 Drawing Sheets

(51) Int. Cl.
*G06N 20/00* (2019.01)
*G11C 7/10* (2006.01)
*G11C 7/20* (2006.01)
*G11C 11/4074* (2006.01)
*G11C 29/02* (2006.01)
*G11C 29/10* (2006.01)
*G11C 29/56* (2006.01)
G11C 29/04 (2006.01)

(52) U.S. Cl.
CPC .................. *G11C 29/56012* (2013.01); *G11C 2029/0407* (2013.01)

(56) References Cited

U.S. PATENT DOCUMENTS

| | | | |
|---|---|---|---|
| 2020/0202493 A1* | 6/2020 | Brownlee | G06T 5/20 |
| 2020/0293415 A1* | 9/2020 | Mukherjee | G06N 20/00 |
| 2021/0248416 A1* | 8/2021 | Navon | G06N 20/00 |
| 2022/0163587 A1* | 5/2022 | Froelich | G01R 31/31903 |
| 2022/0189521 A1* | 6/2022 | Hwang | G11C 7/1093 |

\* cited by examiner

FIG. 3

TR_DATA

| | |
|---|---|
| Calibration Data | CBT(Command Bus Training) – CS(Chip Select) Delay, CA(Command Address) Delay |
| | Write Leveling – CLK to DQs Delay |
| | Read DQ Delay |
| | Write DQ Delay |
| Temperature Data | Controller, NAND, DRAM |
| Voltage Data | SoC, DRAM, Core, I/O IF, Vref_CS, Vref_CA, Vref_R, Vref_W |

FIG. 5

TR_REF

| Calibration Data (Signal Timing Offsets) | Ref Range (min 0 ~ max 300) |
|---|---|
| CBT(Command Bus Training) - CS(Chip Select) Delay, CA(Command Address) Delay | 38~76 |
| Write Leveling - CLK to DQs Delay | 0~20 |
| Read DQ Delay | 145~190 |
| Write DQ Delay | 241~278 |

MEMORY CONTROLLER PERFORMING TRAINING TO IMPROVE COMMUNICATION AND METHOD OF OPERATING THE SAME

CROSS-REFERENCE TO RELATED APPLICATION

The present application claims priority under 35 U.S.C. § 119(a) to Korean patent application number 10-2021-0193757, filed on Dec. 31, 2021, the entire disclosure of which is incorporated herein by reference.

BACKGROUND

1. Field of Invention

The present disclosure relates to an electronic device, and more particularly, to a memory controller and a method of operating the same.

2. Description of Related Art

A storage device is a device that stores data under control of a host device such as a computer or a smartphone. A storage device may include a memory device in which data is stored and a memory controller controlling the memory device. The memory device is divided into a volatile memory device and a non-volatile memory device.

The volatile memory device is a device that stores data only when power is supplied and loses the stored data when the power supply is cut off. The volatile memory device includes a static random access memory (SRAM), a dynamic random access memory (DRAM), and the like.

The non-volatile memory device is a device that does not lose data even though power is cut off. The non-volatile memory device includes a read only memory (ROM), a programmable ROM (PROM), an electrically programmable ROM (EPROM), an electrically erasable and programmable ROM (EEPROM), a flash memory, and the like. The memory controller calibrates signals exchanged with the memory device through training process in the booting operation to increase reliability of communication.

SUMMARY

An embodiment of the present disclosure provides a memory controller having optimized training performance and a method of operating the same.

According to an embodiment of the present disclosure, a memory controller may include a training controller, a training data storage, and a machine learning processor. The training controller may perform training of correcting interface signals exchanged with a memory device, generate training data that is a result of the training, and output the training data as sample training data based on a comparison result of a training reference and the training data. The training data storage may store training history information including plural pieces of sample training data. The machine learning processor may update the training reference through machine learning based on the training history information.

According to an embodiment of the present disclosure, a method of operating a memory controller may include performing training of correcting interface signals exchanged with a memory device, storing training data which is a result of the training, as sample training data based on a comparison result of the training data and a training reference, and updating the training reference through machine learning based on training history information including plural pieces of sample training data.

According to an embodiment of the present disclosure, a method of operating a device may comprise calibrating a signal to be exchanged with an external device, accumulating information representing at least one timing offset of the calibrated signal when the timing offset falls within a threshold range and updating the threshold range based on the accumulated information.

According to the present technology, a memory controller having optimized training performance and a method of operating the same are provided.

BRIEF DESCRIPTION OF THE DRAWINGS

FIG. 3 is a diagram illustrating training data according to an embodiment of the present disclosure.

FIG. 5 is a diagram illustrating a training reference according to an embodiment of the present disclosure.

DETAILED DESCRIPTION

Specific structural or functional descriptions of embodiments according to the concept which are disclosed in the present specification are illustrated only to describe the embodiments according to the concept of the present disclosure. The embodiments according to the concept of the present disclosure may be carried out in various forms and should not be construed as being limited to the embodiments described in the present specification.

Figure 1:
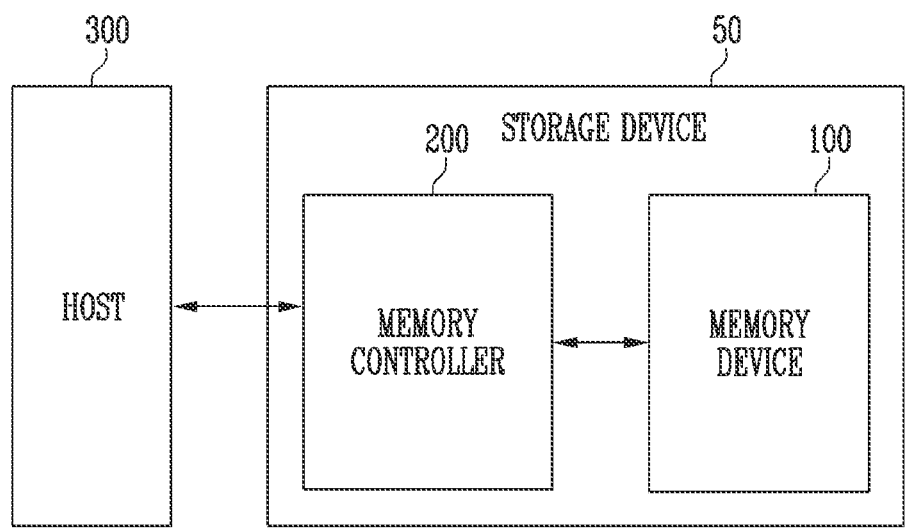
FIG. 1 is a diagram illustrating a storage device according to an embodiment of the present disclosure.

FIG. 1 is a diagram illustrating a storage device according to an embodiment of the present disclosure.

Referring to FIG. 1, the storage device 50 may include a memory device 100 and a memory controller 200 that controls an operation of the memory device. The storage device 50 is a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-e or PCIe) card type storage device, a compact flash (CF) card, a smart media card, and a memory stick.

The storage device 50 may be manufactured as any of various types of packages. For example, the storage device 50 may be manufactured as any of various package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under control of the memory controller 200. The memory device 100 may include a memory cell array including a plurality of memory cells that store data.

Each of the memory cells may be configured as a single level cell (SLC) storing one data bit, a multi-level cell (MLC) storing two data bits, a triple level cell (TLC) storing three data bits, or a quad level cell (QLC) storing four data bits.

In an embodiment, the memory device 100 may include a random access memory RAM and a non-volatile memory (NVM).

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like.

The memory device 100 is configured to receive a command and an address from the memory controller 200 and access an area selected by the address of the memory cell array. That is, the memory device 100 may perform an operation instructed by the command on the area selected by the address. For example, the memory device 100 may perform a write operation (program operation), a read operation, and an erase operation. During the program operation, the memory device 100 may program data to the area selected by the address. During the read operation, the memory device 100 may read data from the area selected by the address. During the erase operation, the memory device 100 may erase data stored in the area selected by the address.

The memory controller 200 controls an overall operation of the storage device 50.

In an embodiment, the memory controller 200 may receive data and a logical block address (LBA) from the host 300 and convert the LBA into a physical block address (PBA) indicating an address of memory cells in which data included in the memory device 100 is to be stored.

The memory controller 200 may control the memory device 100 to perform the program operation, the read operation, or the erase operation in response to a request of the host 300. During the program operation, the memory controller 200 may provide a write command, a physical block address, and data to the memory device 100. During the read operation, the memory controller 200 may provide a read command and the physical block address to the memory device 100. During the erase operation, the memory controller 200 may provide an erase command and the physical block address to the memory device 100.

In an embodiment, the memory controller 200 may control at least two memory devices 100. In this case, the memory controller 200 may control the memory devices 100 according to an interleaving method to improve operation performance. The interleaving method may be an operation method for overlapping operation periods of at least two memory devices 100.

The host 300 may communicate with the storage device 50 using at least one of various communication standards or interfaces such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a non-volatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

Figure 2:
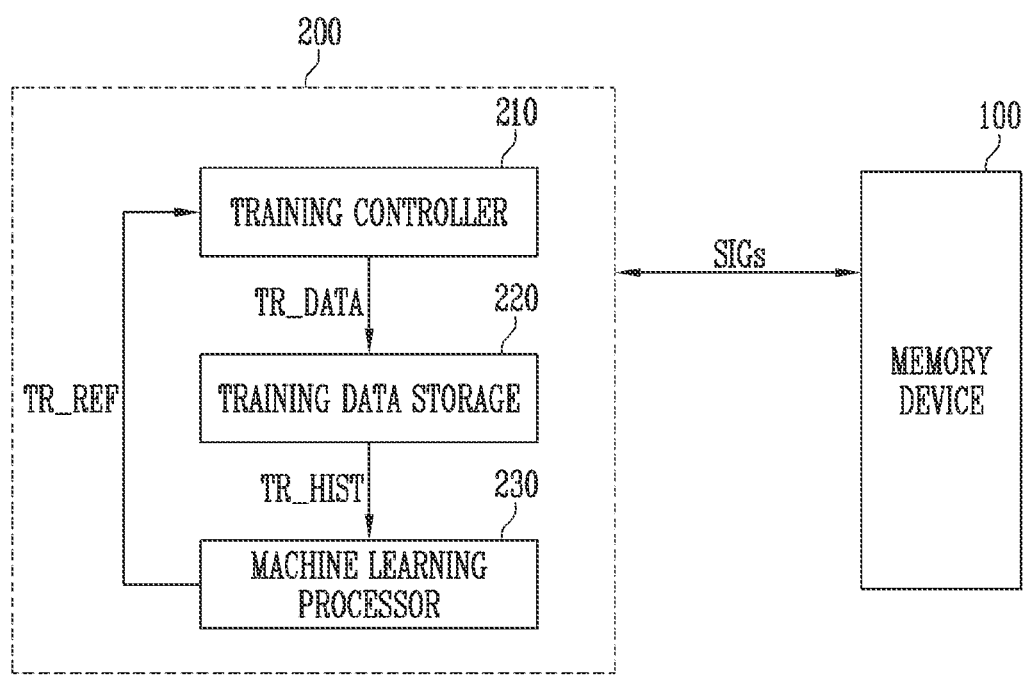
FIG. 2 is a diagram illustrating a structure and an operation of a memory controller of FIG. 1 according to an embodiment of the present disclosure.

FIG. 2 is a diagram illustrating a structure and an operation of the memory controller of FIG. 1 according to an embodiment of the present disclosure.

Referring to FIG. 2, the memory controller 200 may exchange interface signals SIGs with the memory device 100 and communicate with the memory device 100. The interface signals SIGs may include at least one of an interface signal for a random access memory (RAM) and an interface signal for a non-volatile memory (NVM).

The memory controller 200 may include a training controller 210, a training data storage 220, and a machine learning processor 230.

The training controller 210 may perform training of correcting the interface signals SIGs exchanged with the memory device 100. The training controller 210 may generate training data TR_DATA that is a result of the training. The training data TR_DATA may include at least one of temperature data, voltage data, and calibration data indicating a timing offset for the interface signals SIGs.

The training controller 210 may output the training data TR_DATA as sample training data based on a comparison result of a training reference TR_REF and the training data TR_DATA. The training controller 210 may determine whether the training data TR_DATA passes the training reference TR_REF based on whether values of calibration data included in the training data TR_DATA fall within a reference range defined in the training reference TR_REF.

The training controller 210 may store the training data passing the training reference as the sample training data in the training data storage 220. When the training data TR_DATA does not pass the training reference TR_REF, the training controller 210 may perform the training again. The training controller 210 may repeatedly perform the training within a reference number of times.

The training controller 210 may perform the training whenever the memory device 100 is booted on.

The training data storage 220 may store training history information TR_HIST including plural pieces of sample training data.

The machine learning processor 230 may update the training reference TR_REF through machine learning based on the training history information TR_HIST. The machine learning processor 230 may input the plurality of sample training data to a machine learning model, and update the training reference TR_REF based on a result calculated from the machine learning model.

For example, the machine learning processor 230 may calculate a current training reference by differently reflecting a weight to a previous training reference and the calculated result. The machine learning model may be a supervised learning technique, and may include various models of a simple regression analysis model, a multiple regression analysis model, a generalized linear model, and the like.

In a test step of the memory device 100, the training controller 210 may perform test training a preset number of times while changing a voltage condition, a temperature condition, and the like. The training controller 210 may generate test training data that is a result of the test training of the interface signals SIGs. The training controller 210 may check a signal eye margin for the test training data. The training controller 210 may store test training data of which a signal eye margin is in a normal range among the test training data as initial training data in the training data storage 220.

The training data storage 220 may store the test training data of which signal eye margin is in the normal range among plural pieces of test training data generated by the training controller 210, as the initial training data.

The machine learning processor 230 may set the training reference based on plural pieces of initial training data stored in the training data storage 220. At this time, the set training reference may be used as a default training reference in a user step.

FIG. 3 is a diagram illustrating training data according to an embodiment of the present disclosure.

Referring to FIG. 3, the training data TR_DATA may include at least one of the temperature data, the voltage data, and the calibration data indicating the timing offset for the interface signals.

The calibration data may represent a command/address bus signal delay CS Delay and CA Delay, a data strobe signal delay Write Leveling, a data signal write operation delay Write DQ Delay, and a data signal read operation delay Read DQ Delay among the interface signals. A type of the calibration data is not limited to the embodiment, and may further represent delay values of various interface signals used in the storage device.

The temperature data may represent at least one of a temperature of the memory device, a temperature of the memory controller, a temperature of a system chip including the memory controller, a temperature of an input/output interface of the memory device, and a temperature of an input/output interface of the memory controller. A type of the temperature data is not limited to the embodiment, and may further include various temperature values of an internal configuration of the storage device.

The voltage data may represent at least one of a voltage of the memory device, a voltage of the memory controller, a voltage of the system chip including the memory controller, a voltage of the input/output interface of the memory device, a voltage of the input/output interface of the memory controller, and reference voltages for sampling the interface signals exchanged with the memory device. A type of the voltage data is not limited to the embodiment, and may further represent reference voltages for sampling various interface signals used in the storage device. The reference voltages include chip select reference voltage (Vref_CS), command address reference voltage (Vref_CA), read reference voltage (Vref_R) and write reference voltage (Vref_W).

Figure 4:
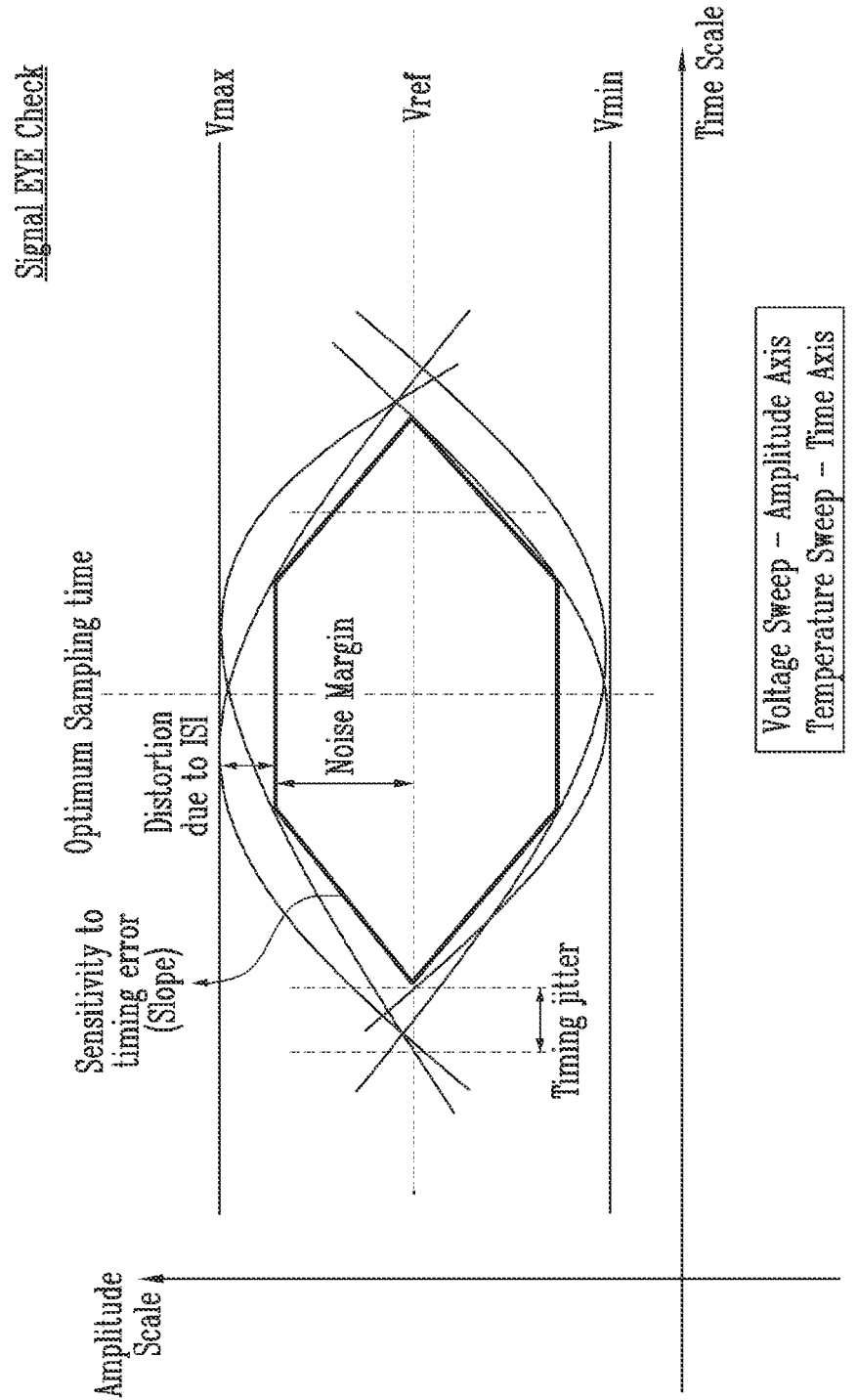
FIG. 4 is a diagram illustrating a signal eye margin check for training data according to an embodiment of the present disclosure.

FIG. 4 is a diagram illustrating a signal eye margin check for training data according to an embodiment of the present disclosure.

Referring to FIG. 4, a horizontal axis of the signal eye may indicate a time and a vertical axis may indicate an amplitude of the interface signal. When adjusting a voltage used in an interface device, the horizontal axis of the interface signal may be adjusted, since the voltage may affect a frequency of the interface signal. When adjusting a temperature of the interface device, the vertical axis of the interface signal may be adjusted, since the temperature may affect a resistor value of the interface device and the resistor value may affect a voltage level of the interface signal.

Parameters of the interface signal may include distortion, sensitivity, noise margin, and timing jitters. For example, the distortion may be a width between an uppermost end of a signal eye pattern and a maximum voltage level of the interface signal. The distortion may be a width between a lowermost end of the signal eye pattern and a minimum voltage level of the interface signal, and it may be better as the width is narrower. As the width is narrower, the signal eye pattern is bigger. The sensitivity may be a measure of sensitivity to a time error through a slope of the signal eye pattern, and it may be better as the slope is steeper. As the slope is steeper, the signal eye pattern is bigger. The noise margin may be an open height of a signal eye, and it may be better as the height is higher. The timing jitter may be a measure of a portion where an increase and a decrease of a waveform intersect, and it may be better as the timing jitter is narrower.

In an embodiment, the training controller may calculate the signal eye margin by analyzing a trajectory and parameter values of the interface signals. When the interface signal has a signal eye margin value within a normal range, the training controller may determine that the interface signal passes the signal eye margin check. When the interface signal has a signal eye margin value outside the normal range, the training controller may determine that the interface signal does not pass the signal eye margin check.

Specifically, the training controller may determine that the corresponding interface signal does not pass through the signal eye margin check when a margin value of a signal eye is calculated when waveforms of the interface signal are overlapped on a time axis.

FIG. 5 is a diagram illustrating a training reference according to an embodiment of the present disclosure.

Referring to FIG. 5, the training reference TR_REF may include a reference range for delay values of the interface signals included in the calibration data.

In FIG. 5, the reference range of the calibration data may be a minimum of 0 to a maximum of 300, and a time unit may be a microsecond. However, minimum and maximum values and the time unit are not limited to the embodiment.

Values of the reference range defined in the training reference TR_REF are not limited to the embodiment and may be variously set.

The calibration data included in the training data may include the command/address bus signal delay CS Delay and CA Delay, the data strobe signal delay Write Leveling, the data signal write operation delay Write DQ Delay, and the data signal read operation delay Read DQ Delay.

In FIG. 5, the sample training data may be training data, in which each of the command/address bus signal delay CS Delay and CA Delay, the data strobe signal delay Write Leveling, the data signal write operation delay Write DQ Delay, and the data signal read operation delay Read DQ Delay, falls within the reference range defined in the training reference TR_REF.

Figure 6:
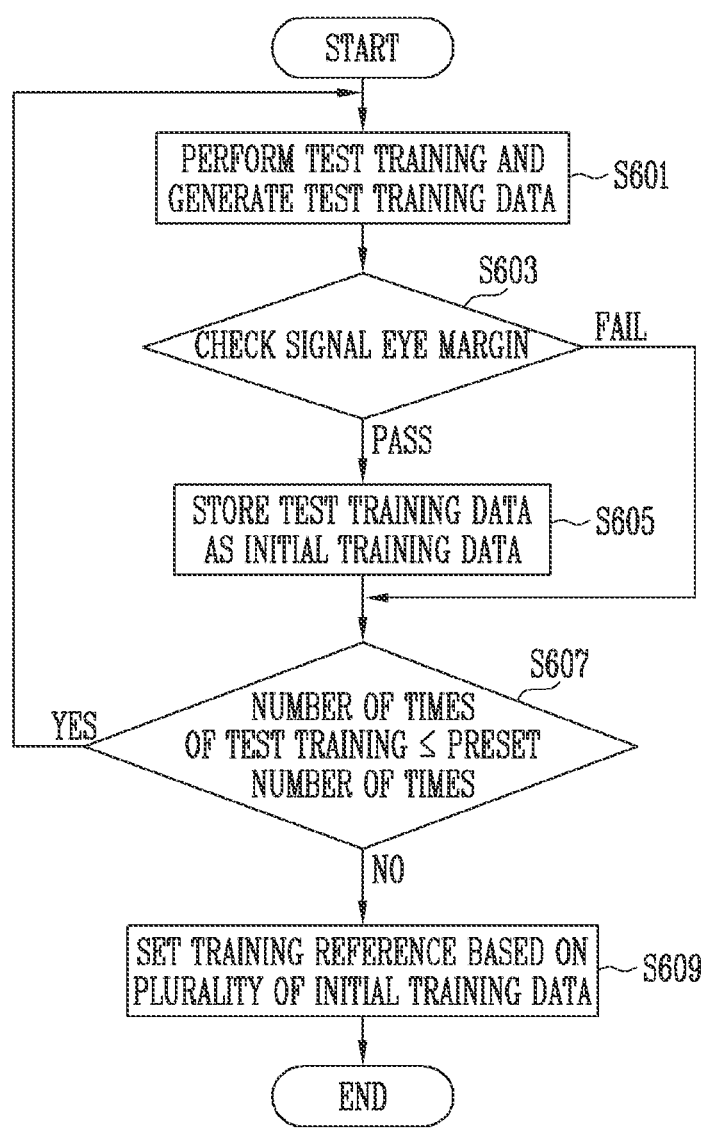
FIG. 6 is a flowchart illustrating an operation of a memory controller according to an embodiment of the present disclosure.

FIG. 6 is a flowchart illustrating an operation of a memory controller according to an embodiment of the present disclosure.

Referring to FIG. 6, in operation S601, the memory controller may perform the test training and generate the test training data. For example, in a test step of the memory device, the memory controller may perform the test training while changing the voltage condition, the temperature condition, and the like.

In operation S603, the memory controller may check the signal eye margin for the test training data. As a result of the check, when the test training data passes the signal eye margin check, the operation proceeds to operation S605, and when the test training data fails the signal eye margin check, the operation proceeds to operation S607.

In operation S605, the memory controller may store the test training data passing the signal eye margin check as the initial training data.

In operation S607, the memory controller may determine whether the number of times of the test training is less than or equal to a preset number of times. As a result of the determination, when the number of times of the test training is less than or equal to the preset number of times, the operation proceeds to operation S601, and when the number of times of the test training exceeds the preset number of times, the operation proceeds to operation S609.

In operation S609, the memory controller may set the training reference based on the plurality of stored initial training data. At this time, the set training reference may be used as the default training reference in the user step.

According to an embodiment, the memory controller may set the default training reference used in the user step based on the initial training data acquired in the test step. The default training reference may be updated at the user step later.

Figure 7:
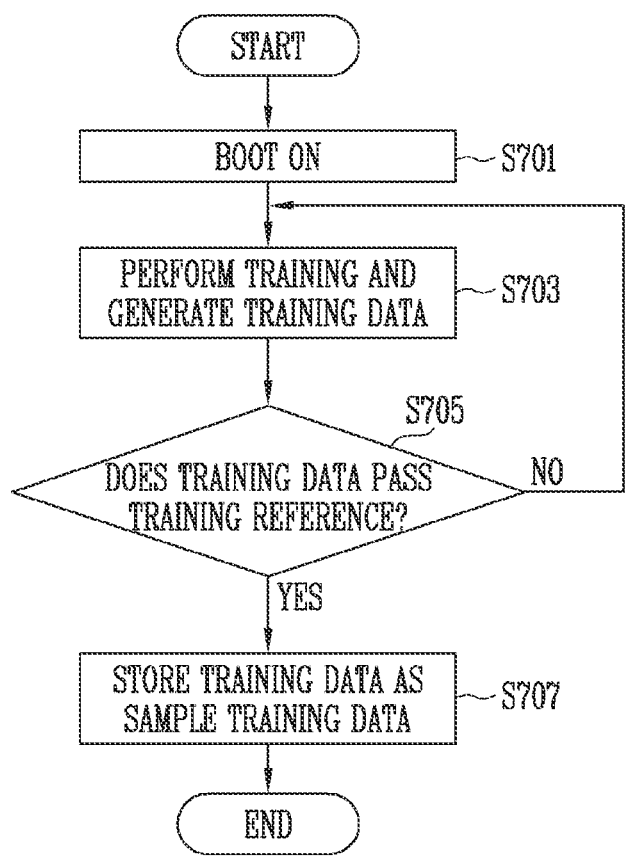
FIG. 7 is a flowchart illustrating an operation of a memory controller according to an embodiment of the present disclosure.

FIG. 7 is a flowchart illustrating an operation of a memory controller according to an embodiment of the present disclosure.

Referring to FIG. 7, in operation S701, the memory controller may boot on the memory device.

In operation S703, when the memory device is booted on, the memory controller may perform the training of correcting the interface signal exchanged with the memory device and generate the training data.

In operation S705, the memory controller may determine whether the training data passes the training reference. As a result of the determination, when the training data passes the training reference, the operation may proceed to operation S707, and when the training data does not pass the training reference, the operation may proceed to operation S703.

In operation S707, the memory controller may store the training data passing the training reference as the sample training data.

Figure 8:
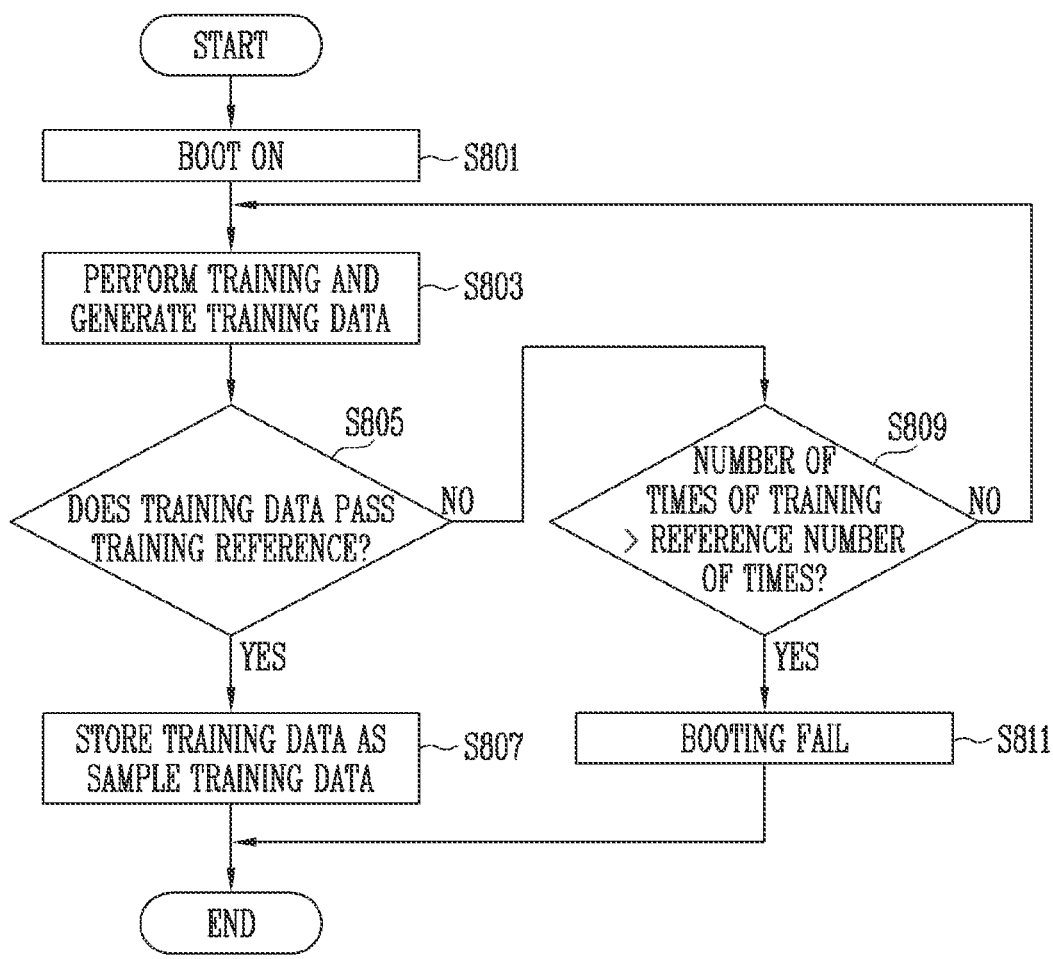
FIG. 8 is a flowchart illustrating an operation of a memory controller according to an embodiment of the present disclosure.

FIG. 8 is a flowchart illustrating an operation of a memory controller according to an embodiment of the present disclosure.

Referring to FIG. 8, in operation S801, the memory controller may boot on the memory device.

In operation S803, when the memory device is booted on, the memory controller may perform the training of correcting the interface signal exchanged with the memory device and generate the training data.

In operation S805, the memory controller may determine whether the training data passes the training reference. As a result of the determination, when the training data passes the training reference, the operation may proceed to operation S807, and when the training data does not pass the training reference, the operation may proceed to operation S809.

In operation S807, the memory controller may store the training data passing the training reference as the sample training data.

In operation S809, the memory controller may determine whether the number of times of the training exceeds a reference number of times. As a result of the determination, when the number of times of the training exceeds the reference number of times, the operation may proceed to operation S811, and when the number of times of the training is less than or equal to the reference number of times, the operation may proceed to operation S803.

In operation S811, the memory controller may fail booting of the memory device.

Figure 9:
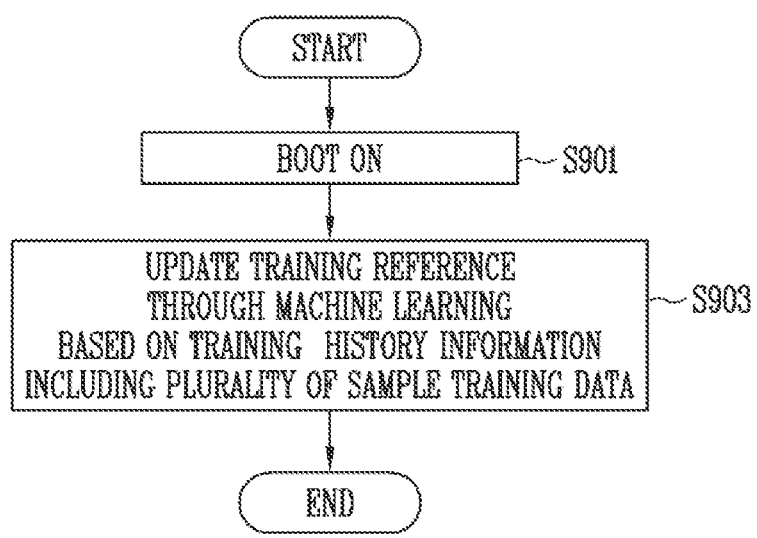
FIG. 9 is a flowchart illustrating an operation of a memory controller according to an embodiment of the present disclosure.

FIG. 9 is a flowchart illustrating an operation of a memory controller according to an embodiment of the present disclosure.

Referring to FIG. 9, in operation S901, the memory controller may boot on the memory device.

In operation S903, when the memory device is booted on, the memory controller may update the training reference through the machine learning based on the training history information including the plurality of sample training data. The training history information may be information obtained by grouping the sample training data acquired during a previous booting operation.

Figure 10:
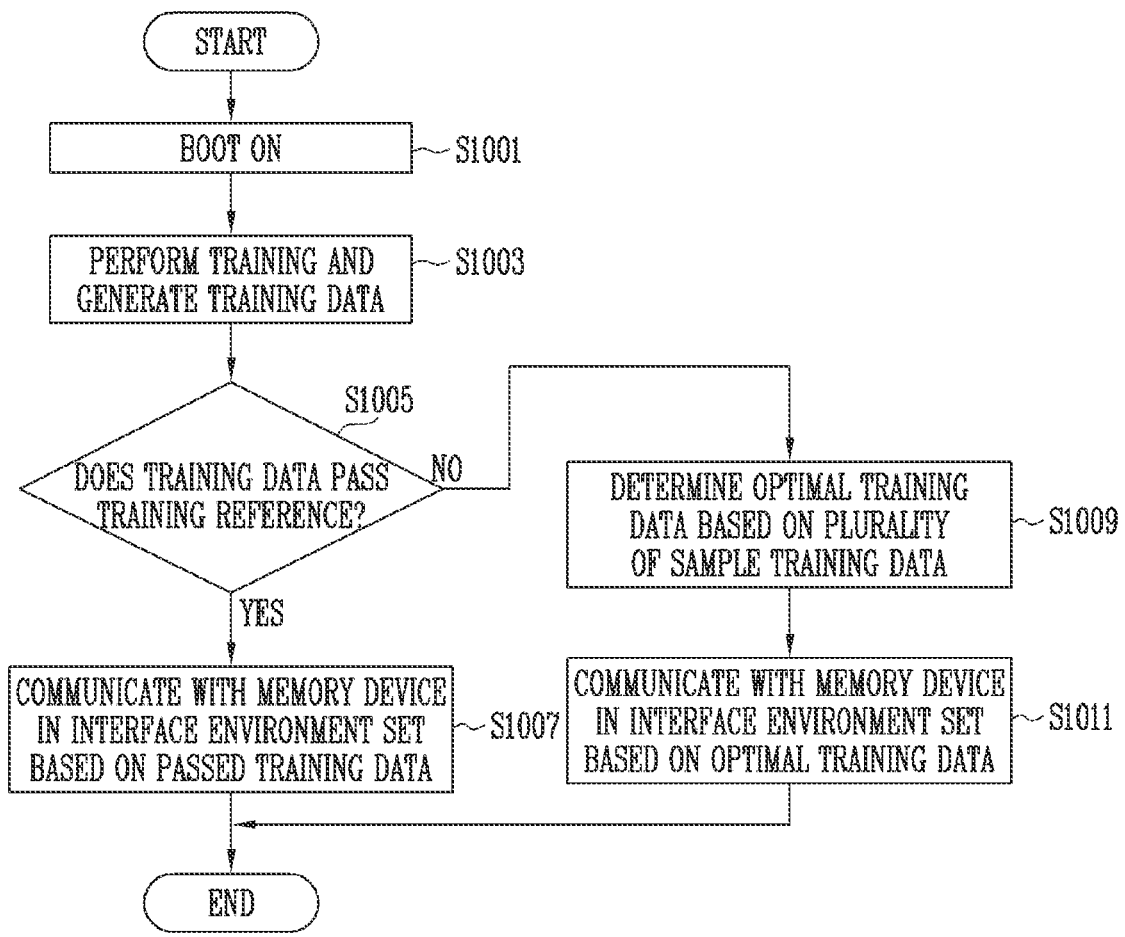
FIG. 10 is a flowchart illustrating an operation of a memory controller according to an embodiment of the present disclosure.

FIG. 10 is a flowchart illustrating an operation of a memory controller according to an embodiment of the present disclosure.

Referring to FIG. 10, in operation S1001, the memory controller may boot on the memory device.

In operation S1003, when the memory device is booted on, the memory controller may perform the training of correcting the interface signal exchanged with the memory device and generate the training data.

In operation S1005, the memory controller may determine whether the training data passes the training reference. As a result of the determination, when the training data passes the training reference, the operation may proceed to operation S1007, and when the training data does not pass the training reference, the operation may proceed to operation S1009.

In operation S1007, the memory controller may communicate with the memory device in an interface environment set based on the training data passing the training reference.

In operation S1009, the memory controller may determine optimal training data based on the plurality of sample training data. The optimal training data may be an intermediate value, a median value, an average value, a representative value, or the like of the sample training data.

In operation S1011, the memory controller may communicate with the memory device in an interface environment set based on the optimal training data.

Referring to operations S1007 to S1011 according to an embodiment of the present disclosure, even though the training data does not pass the training reference, the memory controller may skip the training operation without repeatedly performing the training operation by utilizing the optimal training data. Therefore, a booting time for the memory device may be shortened.

Figure 11:
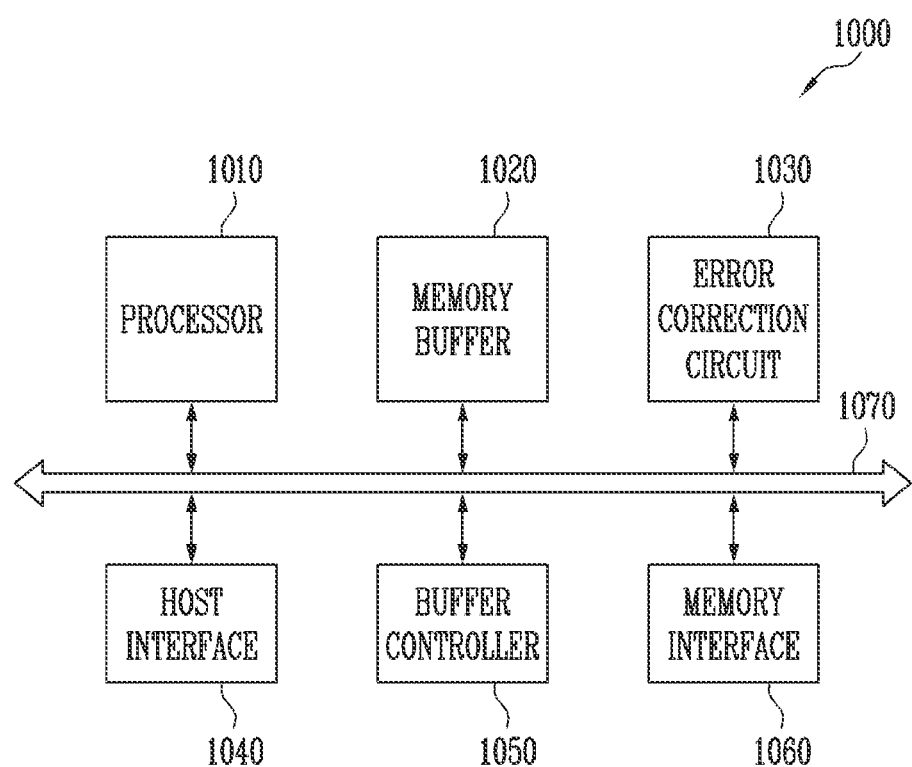
FIG. 11 is a diagram illustrating the memory controller of FIG. 1 according to another embodiment of the present disclosure.

FIG. 11 is a diagram illustrating the memory controller of FIG. 1 according to another embodiment of the present disclosure.

Referring to FIG. 11, the memory controller 1000 is connected to a host Host and the memory device. The memory controller 1000 is configured to access the memory device in response to a request from the host Host. For example, the memory controller 1000 is configured to control the write, read, erase, and background operations of the memory device. The memory controller 1000 is configured to provide an interface between the memory device and the host Host. The memory controller 1000 is configured to drive firmware for controlling the memory device.

The memory controller 1000 may include a processor 1010, a memory buffer 1020, an error correction circuit (ECC) 1030, a host interface 1040, a buffer controller 1050, a memory interface 1060, and a bus 1070.

The bus 1070 may be configured to provide a channel between components of the memory controller 1000.

The processor 1010 may control an overall operation of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of a flash translation layer (FTL). The processor 1010 may convert an LBA provided by the host into a PBA through the FTL. The FTL may receive the LBA and convert the LBA into the PBA by using a mapping table. An address mapping method of the flash translation layer may include various methods according to a mapping unit. A representative address mapping method includes a page mapping method, a block mapping method, and a hybrid mapping method.

The processor 1010 is configured to randomize data received from the host Host. For example, the processor 1010 may randomize the data received from the host Host using a randomizing seed. The randomized data is provided to the memory device as data to be stored and is programmed to the memory cell array.

The processor 1010 is configured to de-randomize data received from the memory device during the read operation. For example, the processor 1010 may de-randomize the data received from the memory device using a de-randomizing seed. The de-randomized data may be output to the host Host.

In an embodiment, the processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The ECC 1030 may perform error correction. The ECC 1030 may perform error correction encoding (ECC encoding) based on data to be written to the memory device through memory interface 1060. The error correction encoded data may be transferred to the memory device through the memory interface 1060. The ECC 1030 may perform error correction decoding (ECC decoding) on the data received from the memory device through the memory interface 1060. For example, the ECC 1030 may be included in the memory interface 1060 as a component of the memory interface 1060.

The host interface 1040 is configured to communicate with an external host under control of the processor 1010. The host interface 1040 may be configured to perform communication using at least one of various communication standards or interfaces such as a universal serial bus (USB), a serial AT attachment (SATA), a serial attached SCSI (SAS), a high speed interchip (HSIC), a small computer system interface (SCSI), a peripheral component interconnection express (PCI-e), a non-volatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

For example, the memory controller 1000 may not include the memory buffer 1020 and the buffer controller 1050.

For example, the processor 1010 may control the operation of the memory controller 1000 using codes. The processor 1010 may load the codes from a non-volatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other and may not interfere with each other or affect each other. The data bus may be connected to the host interface 1040, the buffer controller 1050, the ECC 1030, and the memory interface 1060. The control bus may be connected to the host interface 1040, the processor 1010, the buffer controller 1050, the memory buffer 1020, and the memory interface 1060.

Figure 12:
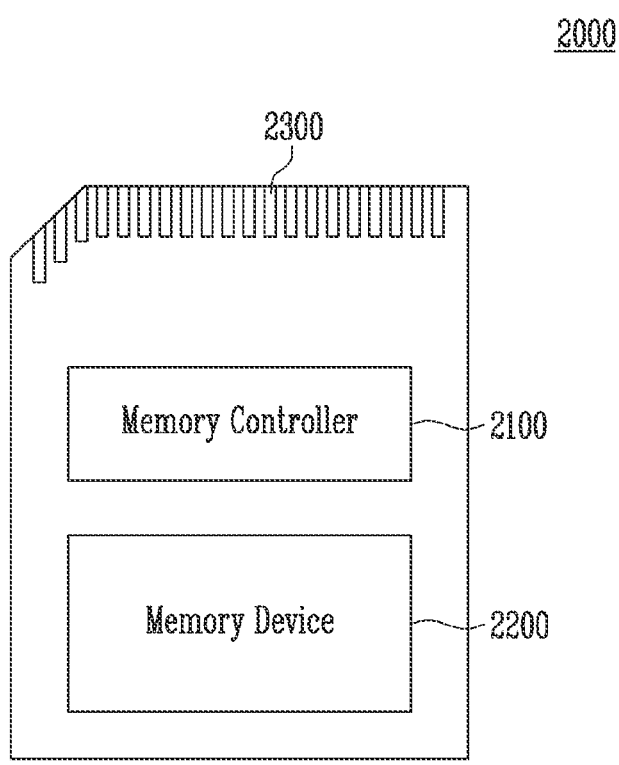
FIG. 12 is a block diagram illustrating a memory card system to which a storage device according to an embodiment of the present disclosure is applied.

FIG. 12 is a block diagram illustrating a memory card system to which a storage device according to an embodiment of the present disclosure is applied.

Referring to FIG. 12, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control read, write, erase, and background operations of the memory device 2200. The memory controller 2100 is configured to provide an interface between the memory device 2200 and a host Host. The memory controller 2100 is configured to drive firmware for controlling the memory device 2200. The memory controller 2100 may be implemented identically to the memory controller 200 described with reference to FIG. 1.

For example, the memory controller 2100 may include components such as a random access memory (RAM), a processor, a host interface, a memory interface, and an ECC.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards or interfaces such as a universal serial bus (USB), a multimedia card (MMC), an embedded MMC (eMMC), a peripheral component interconnection (PCI), a PCI express (PCI-e or PCIe), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

For example, the memory device 2200 may be configured of various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque-magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 13:
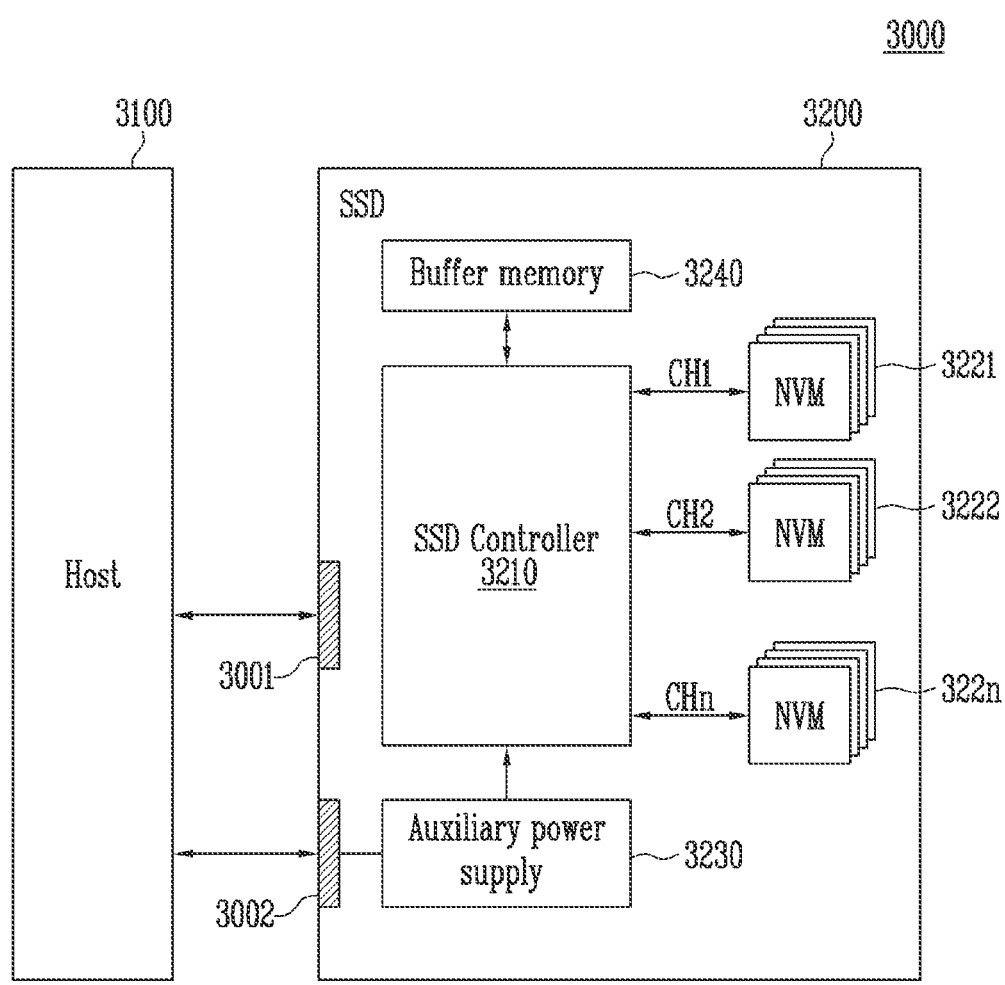
FIG. 13 is a block diagram illustrating a solid state drive (SSD) system to which a storage device according to an embodiment of the present disclosure is applied.

FIG. 13 is a block diagram illustrating a solid state drive (SSD) system to which a storage device according to an embodiment of the present disclosure is applied.

Referring to FIG. 13, the SSD system 3000 includes a host 3100 and an SSD 3200. The SSD 3200 exchanges a signal with the host 3100 through a signal connector 3001 and receives power PWR through a power connector 3002. The SSD 3200 includes an SSD controller 3210, a plurality of flash memories 3221 to 322n, an auxiliary power supply 3230, and a buffer memory 3240.

According to an embodiment of the present disclosure, the SSD controller 3210 may perform the function of the memory controller 200 described with reference to FIG. 1.

The SSD controller 3210 may control the plurality of flash memories 3221 to 322n in response to the signal received from the host 3100. For example, the signal may be signals based on an interface between the host 3100 and the SSD 3200. For example, the signal may be a signal defined by at least one of communication standards or interfaces such as a universal serial bus (USB), a multimedia card (MMC), an embedded MMC (eMMC), a peripheral component interconnection (PCI), a PCI express (PCI-e or PCIe), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power supply 3230 is connected to the host 3100 through the power connector 3002. The auxiliary power supply 3230 may receive the power PWR from the host 3100 and may charge the power. The auxiliary power supply 3230 may provide power to the SSD 3200 when power supply from the host 3100 is not smooth. For example, the auxiliary power supply 3230 may be positioned in the SSD 3200 or may be positioned outside the SSD 3200. For example, the auxiliary power supply 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store meta data (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

Figure 14:
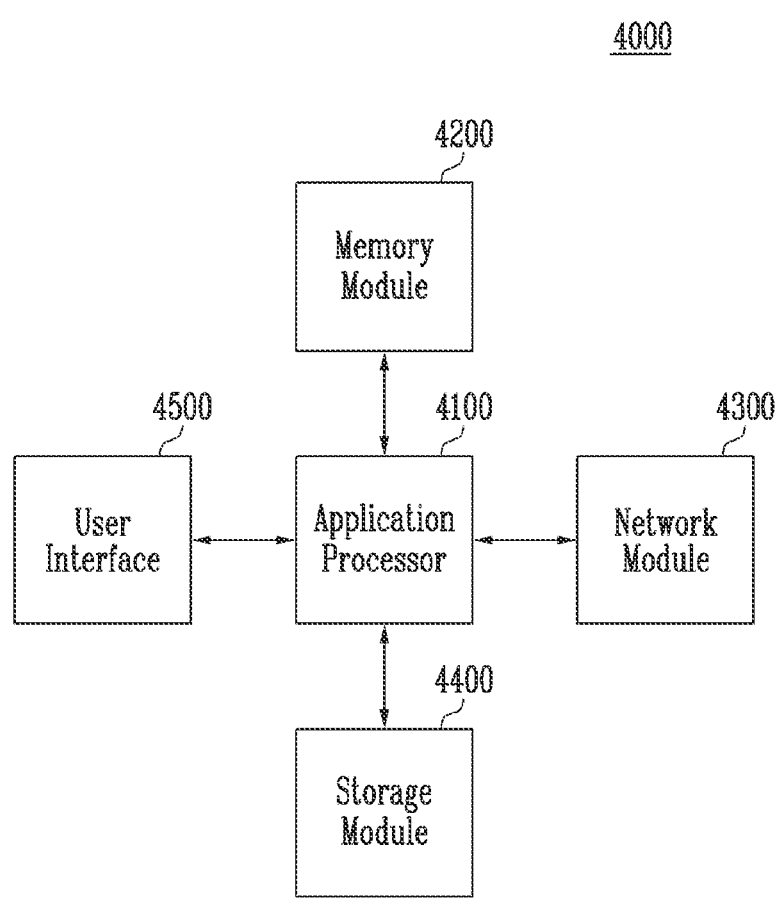
FIG. 14 is a block diagram illustrating a user system to which a storage device according to an embodiment of the present disclosure is applied.

FIG. 14 is a block diagram illustrating a user system to which a storage device according to an embodiment of the present disclosure is applied.

Referring to FIG. 14, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDRAM, an LPDDR2 SDRAM, and an LPDDR3 SDRAM, or a non-volatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, WiMAX, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of non-volatile memory devices, and the plurality of non-volatile memory devices may operate identically to the memory device 100 described with reference to FIG. 1. The storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

As such, the person skilled in the art can appreciate that the present disclosure can be carried out in other specific forms without changing the technical spirit or essential features of the present disclosure. Therefore, it should be understood that the embodiments described above are not restrictive but illustrative in all aspects. The scope of the present disclosure is defined by the claims to be described below rather than the detailed description, and all the changed or modified forms derived from the meaning and scope of the claims and the equivalent concept thereto should be construed as being included in the scope of the present disclosure. Furthermore, the embodiments may be combined to form additional embodiments.

What is claimed is:

1. A memory controller comprising:
a training controller configured to
perform training of correcting interface signals exchanged with a memory device,
generate training data that is a result of the training and includes a timing offset for the interface signals, and
output the training data as sample training data when the training data passes a training reference;
a training data storage configured to store training history information including plural pieces of sample training data; and
a machine learning processor configured to update the training reference through machine learning based on the training history information whenever the memory device is booted on,
wherein the machine learning processor is configured to update the training reference by calculating a current training reference by differently reflecting a weight to a previous training reference.

2. The memory controller of claim 1, wherein the training data includes at least one of temperature data, voltage data, and calibration data indicating the timing offset for the interface signals.

3. The memory controller of claim 2, wherein the temperature data includes at least one of a temperature of the memory device, a temperature of the memory controller, a temperature of a system chip including the memory controller, a temperature of an input/output interface of the memory device, and a temperature of an input/output interface of the memory controller.

4. The memory controller of claim 2, wherein the voltage data includes at least one of a voltage of the memory device, a voltage of the memory controller, a voltage of a system chip including the memory controller, a voltage of an input/output interface of the memory device, a voltage of an input/output interface of the memory controller, and reference voltages for sampling interface signals exchanged with the memory device.

5. The memory controller of claim 2, wherein the calibration data includes at least one of a delay of a command/address bus signal, a delay of a data strobe signal, a delay during a write operation of a data signal, and a delay during a read operation of the data signal among the interface signals.

6. The memory controller of claim 2, wherein the training controller is further configured to determine whether the training data passes the training reference based on whether values of the calibration data fall within a reference range defined in the training reference.

7. The memory controller of claim 6, wherein the training controller is further configured to store, as the sample training data, the training data passing the training reference in the training data storage.

8. The memory controller of claim 6, wherein the training controller is further configured to perform the training again when the training data does not pass the training reference.

9. The memory controller of claim 1, wherein the machine learning processor updates the training reference based on a result calculated from a machine learning model by inputting the plural pieces of sample training data to the machine learning model.

10. The memory controller of claim 1, wherein the training controller is further configured to
perform test training a preset number of times,
generate test training data that is a result of the test training, and
check a signal eye margin for the test training data.

11. The memory controller of claim 10, wherein the training data storage is further configured to store, as initial training data, test training data of which the signal eye margin is in a normal range among plural pieces of test training data generated by the training controller.

12. The memory controller of claim 11, wherein the machine learning processor is further configured to set the training reference based on plural pieces of initial training data stored in the training data storage.

13. The memory controller of claim 1, wherein the interface signals include at least one of an interface signal for a random access memory (RAM) and an interface signal for a non-volatile memory (NVM).

14. A method of operating a memory controller, the method comprising:
performing training of correcting interface signals exchanged with a memory device;
storing training data, which is a result of the training and includes a timing offset for the interface signals, as sample training data based when the training data passes a training reference; and
updating the training reference through machine learning based on training history information including plural pieces of sample training data whenever the memory device is booted on, wherein the updating the training reference comprises calculating a current training reference by differently reflecting a weight to a previous training reference.

15. The method of claim 14, wherein the training data includes at least one of temperature data, voltage data, and calibration data indicating the timing offset for the interface signals.

16. The method of claim 15, wherein the storing of the training data comprises storing the training data as the sample training data when values of the calibration data fall within a reference range defined in the training reference.

17. The method of claim 14, wherein updating the training reference comprises inputting the plurality of sample training data to a machine learning model, and updating the training reference based on a result calculated from the machine learning model.

18. The method of claim 14, further comprising:
performing test training a preset number of times;
generating plural pieces of test training data that are a result of the test training;
storing test training data of which a signal eye margin is in a normal range among the plural pieces of test training data; and setting the training reference based on plural pieces of initial training data.

19. The method of claim 14, wherein the interface signals include at least one of an interface signal for a random access memory (RAM) and an interface signal for a non-volatile memory (NVM).

20. An operating method of a device, the method comprising:
calibrating a signal to be exchanged with an external device;
accumulating information representing at least one timing offset of the calibrated signal when the at least one timing offset falls within a threshold range; and
updating the threshold range based on the accumulated information whenever the device is booted on,
wherein the accumulated information comprises training data that is generated as a result of training, that falls within the threshold range, and that is stored as sample training data.

* * * * *